United States Patent [19]

Kanayama

[11] Patent Number: 4,989,004
[45] Date of Patent: Jan. 29, 1991

[54] ANALOG-TO-DIGITAL CONVERTING UNIT FOR SUCCESSIVE APPROXIMATION

[75] Inventor: Hideyo Kanayama, Tokyo, Japan
[73] Assignee: NEC Corporation, Japan
[21] Appl. No.: 543,156
[22] Filed: Jun. 25, 1990

[30] Foreign Application Priority Data

Jun. 30, 1989 [JP] Japan .................... 1-168678

[51] Int. Cl.⁵ .................... H03M 1/38; H03M 1/06
[52] U.S. Cl. .................... 341/161; 341/158; 341/118
[58] Field of Search .............. 341/161, 158, 155, 118

[56] References Cited

U.S. PATENT DOCUMENTS

| | | | |
|---|---|---|---|
| 3,846,787 | 11/1974 | Myers et al. | 341/161 X |
| 4,194,185 | 3/1980 | Wilson | 341/161 |
| 4,407,020 | 9/1983 | Helliwell et al. | 341/118 X |
| 4,498,072 | 2/1985 | Moriyama | 341/118 |
| 4,740,776 | 4/1988 | Sloane | 341/118 |
| 4,771,266 | 9/1988 | Nunokawa | 341/161 |

FOREIGN PATENT DOCUMENTS

| | | | |
|---|---|---|---|
| 0343632 | 11/1989 | European Pat. Off. | 341/161 |
| 3727395 | 3/1989 | Fed. Rep. of Germany | 341/161 |

Primary Examiner—William M. Shoop, Jr.
Assistant Examiner—Sharon D. Logan
Attorney, Agent, or Firm—Laff, Whitesel, Conte & Saret

[57] ABSTRACT

For preventing an analog-to-digital converting unit for a successive approximation from error in operation, the analog-to-digital converting unit has not only a first comparator circuit but also second and third comparator circuits for comparing an analog input signal with first and second critical signals indicative of a responsible voltage range, and the second or third comparator circuit produces a first or second warning signal in the presence of the analog input signal output the responsible voltage range, then a sequential approximation controlling circuit restricts a bit signal of an digital output signal thereof which allows a digital-to-analog converting circuit to produce a comparison voltage signal within a predetermined range, thereby preventing the first comparator circuit from a error in operation.

5 Claims, 6 Drawing Sheets

ANALOG-TO-DIGITAL CONVERTING UNIT FOR SUCCESSIVE APPROXIMATION

FIELD OF THE INVENTION

This invention relates to an analog-to-digital converting unit of a successive approximation type and, more particularly, to an analog-to-digital converting unit implemented by complementary MOS inverters (which are abbreviated as "CMOS" inverters).

DESCRIPTION OF THE RELATED ART

The progress of minuatuarization technology allows an integrated circuit to incorporate not only digital circuitry but also analog circuitry such as an analog-to-digital converter. FIG. 1 shows a typical example of such an analog-to-digital converter which comprises a sampling-and-holding circuit 1 periodically sampling an analog input signal Vin and producing a series of sampled voltage signals Vs, a digital-to-analog converting circuit 2 supplied with a reference voltage Vref of about 5 volts and producing a comparison voltage signal Vdac under the supervision of a sequential approximation controlling circuit 3, and an analog comparator 4 comparing each sampled voltage signal Vs with the comparison voltage signal Vdac and producing an output signal indicative of whether the sampled voltage signal Vs is larger or smaller than the comparison voltage signal Vdac. The output signal is supplied from the analog comparator 4 to the sequential approximation controlling circuit 3, and the sequential approximation controlling circuit 3 increments or decrements a digital output signal so as to control the comparison voltage signal Vdac through the converting operation carried out by the digital-to-analog converting circuit 2. The prior art analog-to-digital converting unit is of a CMOS implementation, and most of the component circuitry are formed by series combinations of p-channel type and n-channel type MOS transistors.

The prior art analog-to-digital converting unit thus arranged generally behaves as follows. The digital-to-analog converting circuit 2 initially adjusts the comparison voltage level Vdac to a half of the reference voltage level Vref or 2.5 volts, and the analog comparator 4 compares the sampled voltage signal Vs with the comparison voltage signal Vdac. If the sampled voltage signal Vs is larger than the comparison voltage signal Vdac, the sequential approximation controlling unit 3 regulates the digital output signal Dout so that the comparison voltage signal Vdac is increased to three quarters of the reference voltage level Vref; however, the comparison voltage signal Vdac is regulated to a quarter upon making a decision that the sampled voltage signal Vs is smaller than the comparison voltage signal Vdac. Thus, the sampled voltage signal Vs is sequentially compared with the comparison voltage signal Vdac and the voltage level of the comparison voltage signal Vdac is varied by the sequential approximation controlling unit 3 depending upon the comparison result. If the comparison voltage level Vdac is matched with the sampled voltage signal Vs, the output digital signal Dout is equivalent in value to the sampled voltage level sampled and held in the sampling-and-holding circuit 1.

Turning to FIG. 2 of the drawings, the circuit arrangement of the analog comparator 4 is illustrated in detail. The analog comparator 4 comprises switching elements 4a and 4b supplied at input nodes thereof with the comparison voltage signal Vdac and the sampled voltage signal Vs, a capacitor 4c coupled at one end thereof to the output nodes of the switching elements 4a and 4b, an inverter circuit 4d coupled between the other end of the capacitor 4c and an output node 4e of the analog comparator circuit 4, and a switching element 4f for providing a feed-back loop of the inverter circuit 4d. The inverter circuit 4d has input voltage-to-output voltage characteristics indicated by plots A shown in FIG. 3, and a node between the capacitor 4c and the inverter 4d is hereinbelow labeled with "Vx". The inverter circuit 4d and the switching elements 4a, 4b and 4f are formed by CMOS inverters, respectively.

In operation, when the switching elements 4a and 4f are closed for calibration, the node Vx is varied to a biasing voltage level Vb of the inverter 4d. The amount of electric charges Q accumulated in the capacitor 4c is given by the following equation $$Q = C(Vs - Vb1) \quad \text{(Equation 1)}$$

where C is the capacitance of the capacitor 4c. Subsequently, the switching elements 4b and 4f are opened but the switching element 4a is closed. The electric charges Q is conserved, and the following equation is obtained $$C(Vs - Vb1) = C(Vdac - Vx) \quad \text{(Equation 2)}$$

where Vx stands for a variable voltage level at the node Vx. Solving Equation 2, we obtain $$Vx = Vb1 + (Vdac - Vs) \quad \text{(Equation 3)}$$

The variation of the voltage level dVout at the output node 4e is expressed as $$dVout = -A(Vdac - Vs) \quad \text{(Equation 4)}$$

where A is the gain of the inverter circuit 4d at Vb1. As will be understood from Equation 4, if the sampled voltage signal Vs is higher than the comparison voltage signal Vdac, the variation of the voltage level dVout is positive (which is referred to as value "1" hereinbelow); however, when the sampled voltage level Vs is lower than the comparison voltage level Vdac, the variation of the voltage level dVout becomes negative (which is hereinbelow referred to as value "0"). Thus, the output signal of the analog comparator 4 swings the voltage level Vout thereof depending upon the comparison result.

Turning back to FIG. 1 of the drawings, the circuit behavior of the prior art analog-to-digital converting unit is hereinbelow reviewed from the aspect of the voltage variation Vx. For the sake of simplicity, the analog-to-digital converting unit is assumed to have a resolution of 3 bits. Assuming now that the sampled voltage signal Vs and the biasing voltage level Vb1 are about 5.0 volts and about 1.5 volt, respectively, the switching elements 4b and 4f are closed and, subsequently, opened but the switching element 4a is closed as described hereinbefore. Since the comparison voltage signal Vdac is adjusted to a half of the reference voltage level Vref, the voltage level Vx at the end of a first time interval TS is calculated by using Equation 3

$$Vx = 1.5 + (2.5 - 5) = -1 \text{ (volt)}$$

The comparison voltage signal Vdac of 2.5 volts results in the positive output voltage level Vout, and the sequential approximation controlling unit 3 causes the comparison voltage level Vdac to be increased to three quarters of the reference voltage level Vref or +3.75 volts. The increased comparison voltage signal Vdac lifts up the voltage level Vx through the sequential switching actions of the switching elements 4a, 4b and 4f, and the voltage level Vx reaches +0.25 volt at the end of a second time interval t1. In this way, the voltage level Vx is stepwise increased toward the biasing voltage level Vb1 of 1.5 volt as shown in FIG. 4A, and the digital output signal Dout, accordingly, gets closer to closer toward a certain value equivalent to +5 volts.

However, the prior art analog-to-digital converting unit is assumed to be incorporated in another integrated circuit, and a biasing voltage level Vb2 of 3.5 volts is applied to the inverter circuit 4d. Such a variation in the biasing voltage level Vb2 further takes place due to dispersion of product. If the sampled voltage signal Vs is zero, the voltage level Vx at the end of the first time interval TS is calculated as $$Vx = 3.5 + (2.5 + 0) = +6 \text{ (volts)}$$

The voltage level Vx gradually reaches the biasing voltage level Vb2 as similar to that described in conjunction with FIG. 4A. However, a problem is encountered in the prior art analog-to-digital converting unit in a dynamic range thereof and/or production yield. In detail, the voltage level Vx depends on the biasing voltage level Vbn (where n is a natural number), the sampled voltage signal Vs and the comparison voltage signal Vdac as expressed by Equation 3. If the sampled voltage signal Vs and the biasing voltage level Vb1 are +5 volts and +1.5 volt, the voltage level Vx goes down negative as described in conjunction with FIG. 4A. If the biasing voltage level Vb2 is about 3.5 volts, the sampled voltage signal Vs of zero volt causes the voltage level Vx to exceed the reference voltage level Vref. Since the inverter circuit 4d and the switching elements 4a, 4b and 4f are formed by the CMOS inverters, various p-n junctions are incorporated in each component element. If the voltage level Vx is varied over a regular range between the ground voltage level and the reference voltage level Vref, no problem takes place. However, if the voltage level Vx is out of the regular range such as −1 volt or +6 volts, some p-n junctions are forwardly biased and electrical isolation between the component elements is broken with undesirable current flowing through the forwardly biased p-n junctions. If a p-n junction in the vicinity of the capacitor 4c is forwardly biased and, accordingly, the undesirable current flows into the capacitor 4c, the amount of electric charges accumulated in the capacitor 4c is changed from the value decided upon introduction of the sampled voltage signal Vs. This results in that the analog comparator 4 can not provide any precise comparative result to the sequential approximation controlling unit 3.

In order to prevent the capacitor 4c from undesirable current passing through a p-n junction forwardly biased, the dynamic range or variation of the input analog signal Vin is restricted from 1 volt to 4 volts by way of example, or the biasing voltage level Vbn of 2.5 volts ±0.5 volt is effective against the undesirable forwardly biasing state. The restriction of the dynamic range is not desirable in view of applicability of the analog-to-digital converting unit. On the other hand, the biasing voltage level Vbn in a narrow range deteriorates the production yield of the integrated circuit incorporating the analog-to-digital converting unit, and, as a result, the production cost is undesirably increased.

SUMMARY OF THE INVENTION

It is therefore an important object of the present invention to provide an analog-to-digital converting unit which operates without any sacrifice of dynamic range.

It is also an important object of the present invention to provide an analog-to-digital converting unit which is relatively low in production cost.

To accomplish these objects, the present invention proposes to monitor an analog input signal for restricting a comparison voltage signal within a predetermined range.

In accordance with the present invention, there is provided an analog-to-digital converting unit comprising (a) a sampling-and-holding circuit supplied with an analog input voltage signal and producing a series of sampled voltage signals at time intervals, (b) a sequential approximation controlling circuit responsive to a controlling signal and first and second warning signals and producing a digital output signal with a bit string, (c) a digital-to-analog converting circuit supplied with the digital output signal and producing a comparison voltage signal depending upon the bit string and first and second critical signals respectively indicative of the uppermost and lowermost voltage levels of the analog input voltage signal to which the analog-to-digital converting unit is responsible without trouble, (d) a first analog comparator circuit comparing one of the sampled voltage signals, with the comparison voltage signal and producing the controlling signal, (e) a second analog comparator circuit comparing the analog input voltage signal with the first critical signal and producing the first warning signal, and (f) a third analog comparator circuit comparing the analog input voltage signal with the second critical signal and producing the second warning signal, in which the sequential approximation controlling circuit restricts the bit string in the presence of either first or second warning signal so that the comparison voltage signal is fallen within a predetermined range regardless of the controlling signal for avoiding the trouble.

BRIEF DESCRIPTION OF THE DRAWINGS

The features and advantages of an analog-to-digital converting unit according to the present invention will be more clearly understood from the following description taken in conjunction with the accompanying drawings in which.

DESCRIPTION OF THE PREFERRED EMBODIMENTS

First Embodiment

Figure 1:
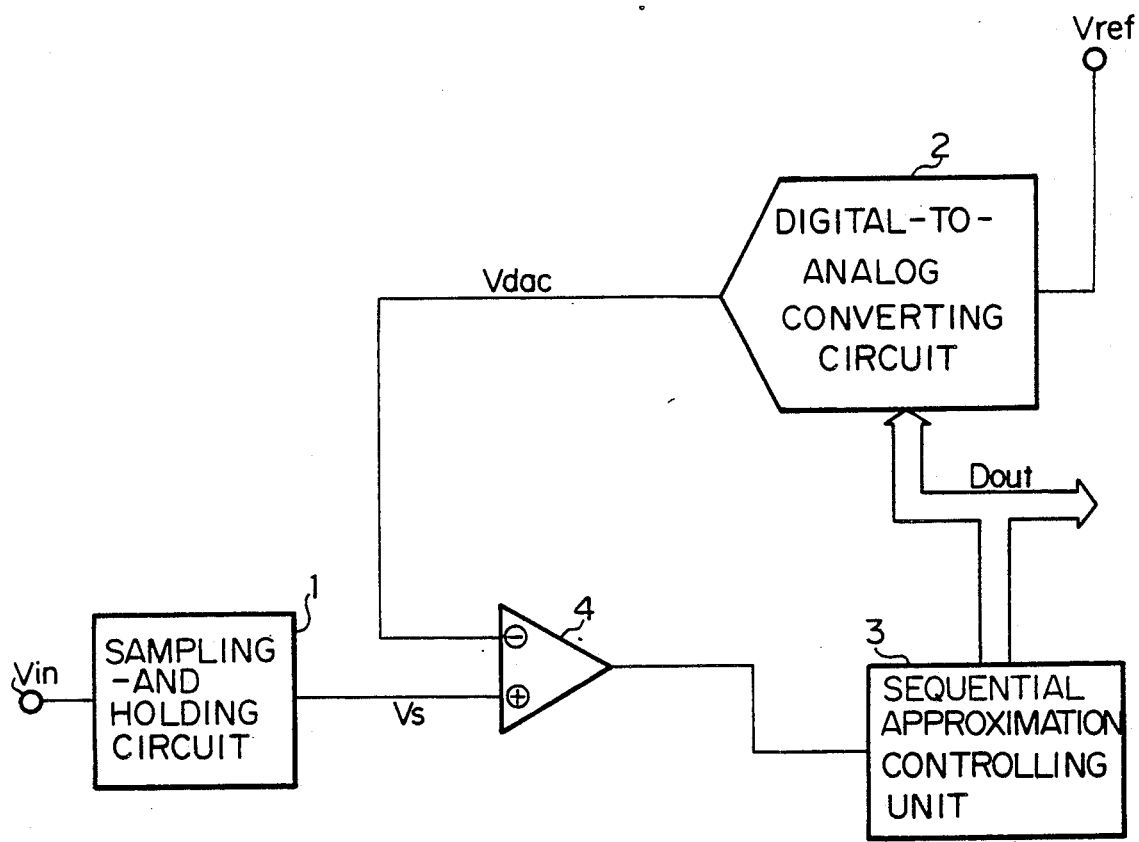
FIG. 1 is a block diagram showing the circuit arrangement of a prior art analog-to-digital converting unit of the successive approximation type.
Figure 2:
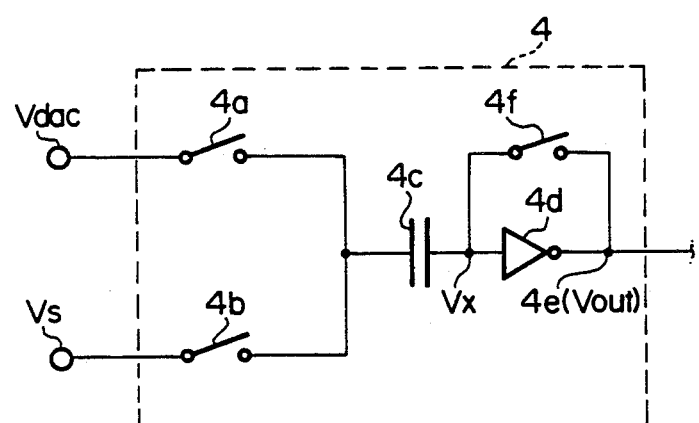
FIG. 2 is a diagram showing the circuit arrangement of an analog comparator incorporated in the prior art analog-to-digital converting unit.
Figure 5:
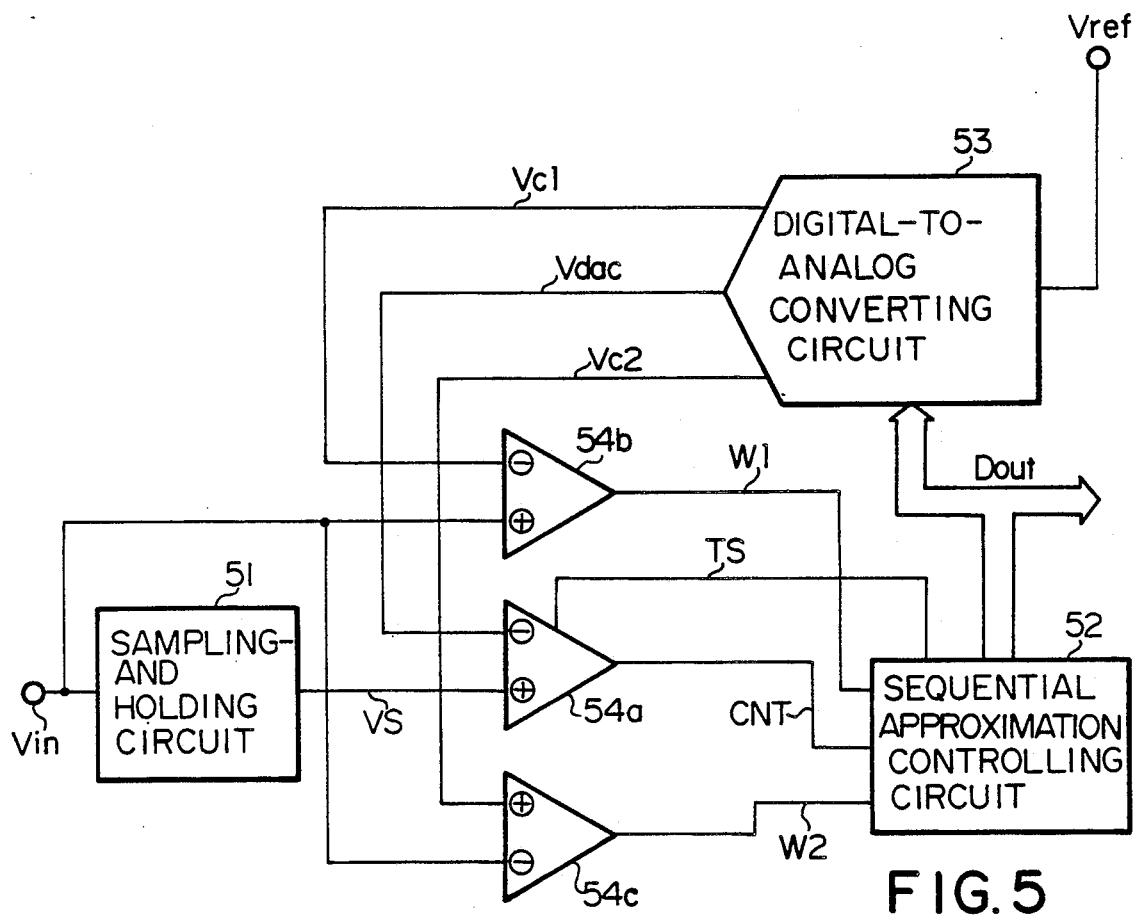
FIG. 5 is a block diagram showing the circuit arrangement of an analog-to-digital converting unit according to the present invention.

Referring FIG. 5 of the drawings, an analog-to-digital converting unit embodying the present invention comprises a sampling-and-holding circuit 51 supplied at the input node thereof with an analog input voltage signal Vin and periodically sampling the analog input voltage signal Vin for producing a series of sampled voltage signals Vs at time intervals, a sequential approximation controlling circuit 52 for producing an digital output signal Dout, a digital-to-analog converting circuit 53 supplied with a reference voltage level Vref and converting the digital output signal Dout into a comparison voltage signal Vdac, and a first analog comparator circuit 54a for comparing the sampled voltage signal Vs with the comparison voltage signal Vdac. Upon comparison with the comparison voltage signal Vdac, the first analog comparator circuit 54a produces a controlling signal CNT indicative of increasing or decreasing the digital output signal Dout in value. The first analog comparator circuit 54a is similar in arrangement to that shown in FIG. 2, and increments or decrements the voltage level of the controlling signal Vs depending upon the comparison result as described hereinbefore. For this reason, component elements are respectively designated by the same reference numerals without any detailed description. In this instance, the initial voltage level of the comparison voltage signal Vdac is adjusted to a half of the reference voltage level Vref.

Figure 6:
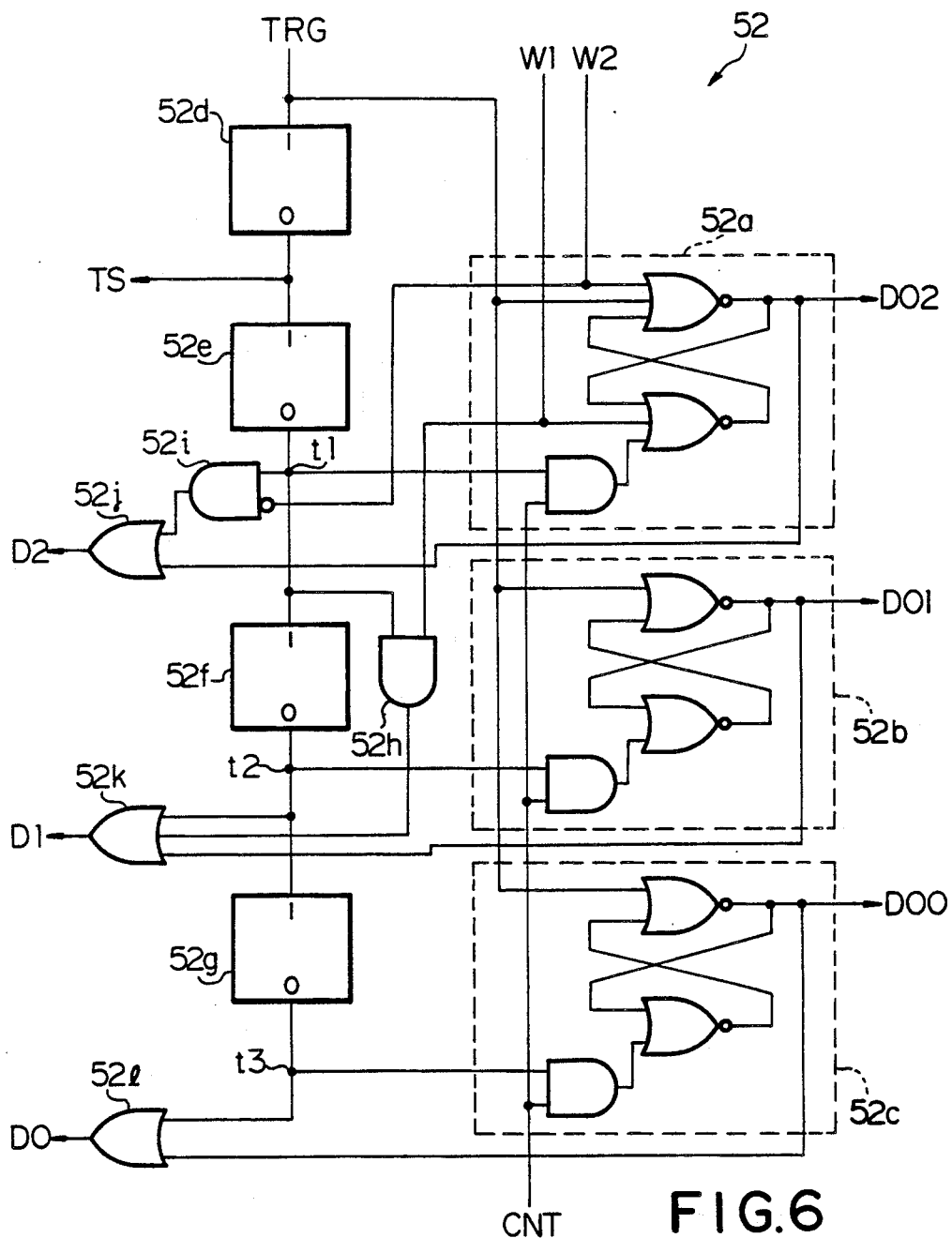
FIG. 6 is a circuit diagram showing the arrangement of a sequential approximation controlling circuit incorporated in the analog-to-digital, converting unit shown in FIG. 5.

The digital-to-analog converting circuit 53 according to the present invention further produces a first critical signal Vc1 adjusted to three quarters of the reference voltage level Vref or about 3.75 volts, and a second critical signal Vc2 adjusted to a quarter of the reference voltage level Vref or about 1.25 volt. The analog-to-digital converting unit shown in FIG. 5 further comprises a second analog comparator circuit 54b and a third analog comparator circuit 54c, and the second and third analog comparator circuits 54b and 54c compares the analog input voltage signal Vin with the first and second critical signals Vc1 and Vc2, respectively. If the analog input voltage signal Vin is larger than the first critical signal Vc1, the second analog comparating circuit 54b produces a first warning signal W1 of logic "1" level, but the second comparator circuit 54b allows the first warning signal W1 to be in logic "0" level upon receipt of the analog input voltage signal Vin smaller than the first critical signal Vc1. On the other hand, when the analog input voltage signal Vin is smaller than the second critical signal Vc2, the third analog comparator circuit 54c produces a second warning signal W2 of logic "1" level; however, the second warning signal W2 remains in logic "0" level upon receipt of the analog input voltage signal Vin higher than the second critical signal Vc2. The first and second warning signals W1 and W2 are supplied in parallel to the sequential approximation controlling circuit 52 together with the controlling signal CNT as described hereinbelow in detail. The sequential approximation controlling circuit 52 according to the present invention is arranged as shown in FIG. 6. The sequential approximation controlling circuit 52 is of the multi-bit digital output signal Dout, however, only three-bits of the digital output signal Dout and the related part of the controlling circuit 52 are illustrated in FIG. 6 for the sake of simplicity. This means that the analog-to-digital converting unit according to the present invention is never limited to the three-bit system.

The sequential approximation controlling circuit 52 comprises three RS flip-flop circuits 52a, 52b and 52c, four D flip-flop circuits 52d, 52e, 52f and 52g, two AND gates 52h and 52i, and three OR gates 52j, 52k and 52l. A trigger signal TRG is supplied to the RS flip flop circuits 52a, 52b and 52c and the D flip flop circuit 52d, and the trigger signal TRG is produced upon start of each conversion of the analog-to-digital converting unit. The RS flip-flop circuits 52a, 52b and 52c and the D flip-flop circuit 52d are shifted to reset-states, respectively, in the presence of the trigger signal TRG. The D flip flop circuit 52d produces that first timing signal TS one clock after the trigger signal TRG which is supplied to the switching elements 4b and 4f for allowing these switching elements 4b and 4f to be closed. As described hereinbefore, after the accumulation of the electric charges in the capacitor 4c, the switching elements 4b and 4f are opened and the switching element 4a is opened. Such a sequential switching action may achieved with a signal which is produced by a monostable multivibrator (not shown) triggered by a complementary signal of the first timing signal TS and, then, delayed by a predetermined time period. When the switching elements 4b and 4c are closed, the capacitor 4c is accumulated with electric charges depending upon the magnitude of the sampled voltage signal Vs and the biasing voltage level Vbn. The controlling signal CNT is supplied in parallel to the RS flip flop circuits 52a, 52b and 52c, and the OR gates 52j, 52k and 52l yield output bits D0, D1 and D2 which form the digital output signal Dout.

Figure 7A:
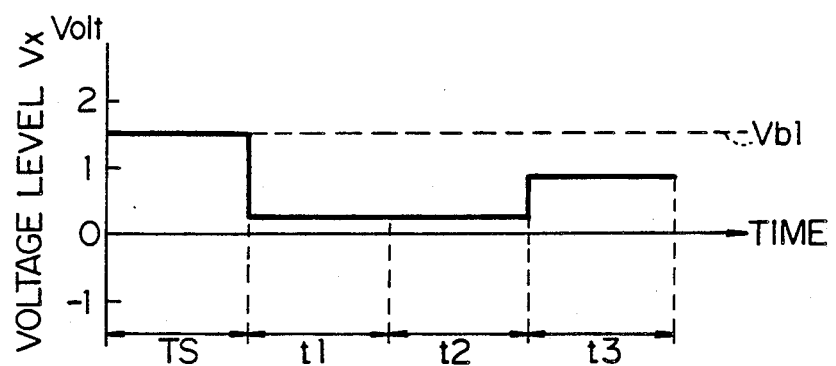
FIGS. 7A and 7B are graphs showing analog-to-digital converting operations carried out by the analog-to-digital converting unit shown in FIG. 5.
Figure 7B:
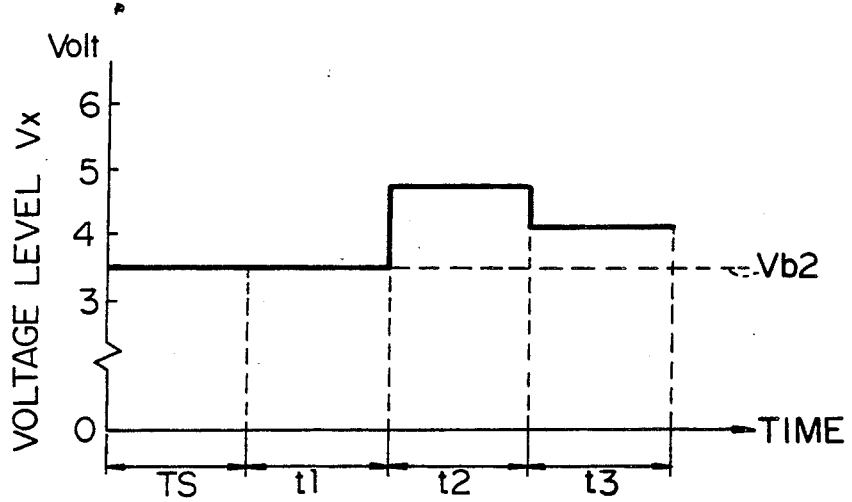

Description is made on an analog-to-digital converting operation with reference to FIGS. 7A and 7B. First, the analog-to-digital converting unit shown in FIG. 5 is assumed to be incorporated in an integrated circuit and have the inverter circuit 4d biased with a positive voltage level Vb1 of about 1.5 volt, and the reference voltage level Vref is adjusted to about +5 volts. If the analog input voltage signal Vin is sampled and produces the sampled voltage signal Vs of about +5 volts, the RS flip flop circuits 52a to 52c and the D flip flop circuit 52d are shifted to the respective reset-states in the presence of the trigger signal TRG. The D flip flop circuit 52d supplies the first timing signal TS to the switching elements 4b and 4f for guiding the sampled voltage signal Vs to the capacitor 4c. The capacitor 4c is accumulated with electric charges as shown in FIG. 7A, and the first comparator circuit 54a is calibrated to about +1.5 volt. The second and third analog comparator circuits 54b and 54c produces the first warning signal W1 of logic "1" level and the second warning signal W2 of logic "0" level, respectively, because the analog input voltage signal Vin exceeds the first critical signal Vc1 of about 3.75 volts but is higher than the second critical signal Vc2 of about 1.25 volt.

Subsequently, when the first timing signal TS is latched in the D flip flop circuit 52e and the second timing signal t1 is produced, the sequence proceeds to the second stage t1 of FIG. 7A. The switching elements 4b and 4c are opened, and the switching element 4a is closed. The initial comparison voltage signal Vdac of about +2.5 volts is relayed to the capacitor 4c, and the voltage level dVout is changed to a certain value calculated from Equation 4. However, the first warning signal W1 of logic "1" level cause the RS flip-flop circuit 52a to enter the set-state, and the output signal DO2 of logic "1" level cause the OR gate 52j to yield the output bit D2 of logic "1" level. The controlling signal CNT is in value "1" because of the sampled voltage signal Vs higher than the initial comparison voltage signal Vdac and, accordingly, allows the RS flip flop circuits 52b and 52c remain in the respective reset-states. Even though a third timing signal t2 remains in the logic "0" level, the first warning signal W1 and the second timing signal t1 cause the AND gate 52h to produce the output bit D1 of logic "1" level which in turn causes the OR gate 52k to yield the output bit D1 of logic "1" level. However, since the fourth timing signal t3 and the output signal D00 of the RS flip flop circuit 52c are in logic "0" level, the OR gate 52l produces the output bit D0 of logic "0" level. Thus, the digital output signal Dout is represented by the bit string of (110) which is supplied to the analog-to-digital converting circuit 53 for changing the comparison voltage signal Vdac to three quarters of the reference voltage level Vref or about 3.75 volts. Then, the voltage level Vx is calculated by using Equation 3 as $$Vx = 1.5 + (3.75 - 5) = 0.25 \text{ (volt)}$$

The controlling signal CNT remains in value "1" in accordance with Equation 4 because the sampled voltage signal Vs is still higher than the comparison voltage signal Vdac.

When the second timing signal t1 is latched in the D flip flop circuit 52f and produces the third timing signal t2, the analog-to-digital converting unit enters the third stage labeled with t2 in FIG. 7A. The output signal DO2 is still in logic "1" level and causes the OR gate 52j to yield the output bit D2 of logic "1" level. The OR gate produces the output bit D1 in the presence of the third timing signal t2 of logic "1" level, and the third timing signal t2 of logic "1" level and the controlling signal CNT of value "1" allows the AND gate of the RS flip flop circuit 52b to produce the output signal of logic "1" level which in turn changes the output signal D01 to logic "1" level. The output signal DO1 is fed back to the OR gate 52k, but no confusion takes place because the output bit D1 has been already change to logic "1" level. The OR gate 52l allows the output bit D0 to remain in logic "0" level in the co-presence of the fourth timing signal t3 and the output signal D00 both in logic "0" level. Thus, the bit string of the digital output signal Dout is still (110), and the voltage level Vx continues to be about 0.25 volt as shown in FIG. 7A. The controlling signal CNT still remains in value "1".

However, if the sequence proceeds to the fourth section labeled with "t3" with the fourth timing signal t3 of logic "1" level, the OR gate 52l produces the output bit D0 of logic "1" level, and the AND gate of the RS flip flop circuit 52c causes the RS flip flop circuit 52c to fix the output bit D0 with the output signal D00 of logic "1" level. The output signals D02 and D01 allows the OR gates 52j and 52k to produce the output bits D2 and D1 of logic "1" level, and, for this reason, the digital output signal Dout has the bit string of (111). The digital output signal Dout with the bit string (111) causes the digital-to-analog converting circuit 53 to produce the comparison voltage signal Vdac of about seven eighth of the reference voltage level Vref or about 4.375 volts. The digital output signal Dout is thus successively approximated to a value equivalent to the sampled voltage signal Vs. The voltage level Vx is calculated as $$Vx = 1.5 + (4.375 - 5) = 0.875 \text{ (volt)}$$

Thus, the voltage level Vx never goes down below the ground level even though the analog input voltage signal has an extremely high voltage level, and, therefore, no forward biasing takes place at an p-n junction around the capacitor 4c. This results in that the analog-to-digital converting unit according to the present invention is free from any error in operation due to undesirable current across the p-n junction, and the reliability is improved.

Figure 3:
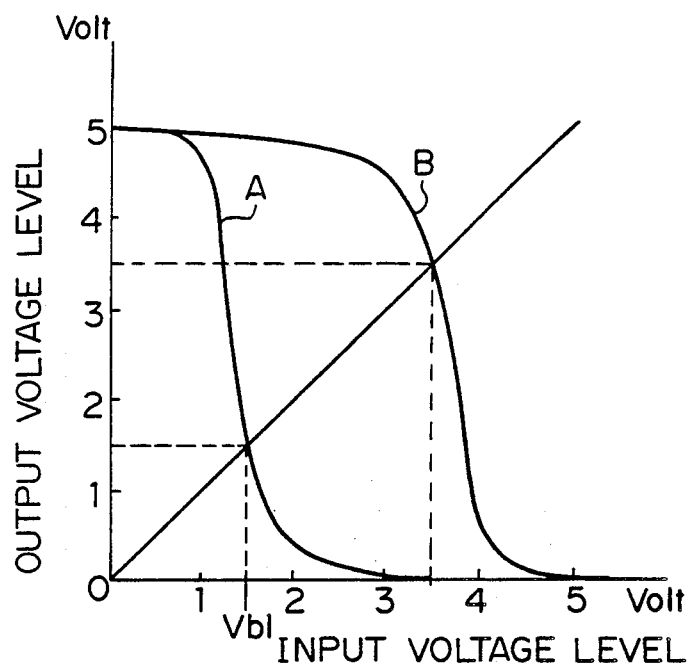
FIG. 3, is a graph showing input voltage-to-output voltage characteristics of inverters incorporated in the prior analog-to-digital converting unit and an analog-to-digital converting unit according to the present invention, respectively.
Figure 4A:
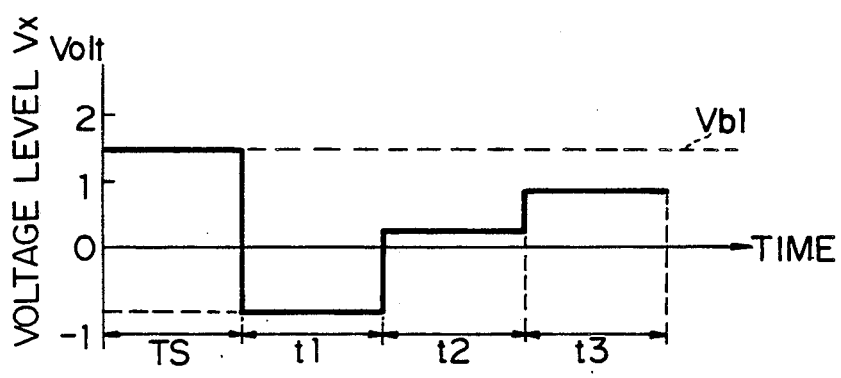
FIG. 4A and 4B are graphs showing analog-to-digital converting operations carried out by the prior art analog-to-digital converting unit.
Figure 4B:
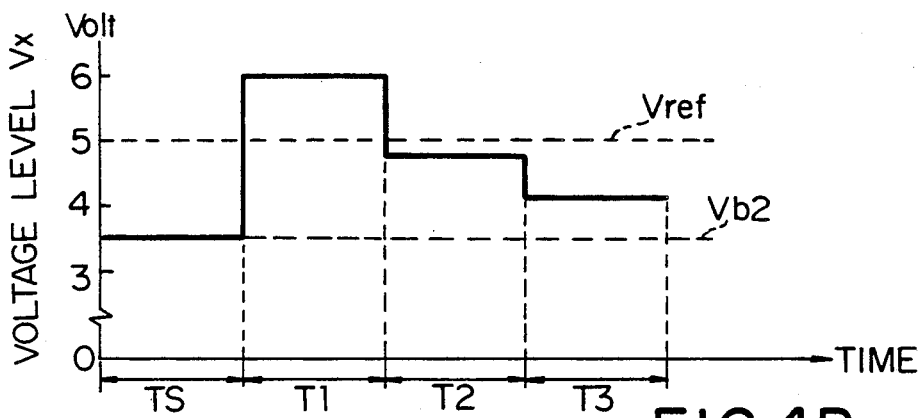

If, on the other hand, the inverter circuit 4d is assumed to have input-to-output voltage characteristics indicated by plots B of FIG. 3. The biasing voltage level Vb2 and the reference voltage level Vref are assumed to be approximately equal to those of the prior art described in conjunction with FIG. 4B, i.e. Vb2 = 3.5 volts and Vref = 5 volts, and the sampling-and-holding circuit 51 produces a sampled voltage signal Vs of about 0.0 volt. Then, the trigger signal TRG is supplied to the RS flip flop circuits 52a to 52c and the D flip flop circuit 52d, and these flip flop circuits 52a to 52d are shifted to the respective reset-states. The D flip flop circuit 52d produces the first timing signal TS with the first appearance of the clock signal, and the first stage TS starts as shown in FIG. 7B. The first timing signal TS causes the switching elements 4b and 4f to turn on, and the first comparating circuit 54a is calibrated. The voltage level Vx is regulated with the sampled voltage signal Vs and the biasing signal Vb2 to about 3.5 volts.

Subsequently, the first timing signal TS is latched in the D flip flop circuit 52e, and the second timing signal t1 appears at the output node thereof. Then, the analog-to-digital converting unit enters the second stage t1 as shown in FIG. 7B. The second and third comparator circuits 54b and 54c respectively produces the first warning signal W1 of logic "0" level and the second warning signal W2 of logic "1" level because the sampled voltage signal Vs is lower than the first critical signal Vc1 but is higher than the second critical signal Vc2. Even if the first timing signal t1 is logic "1" level, complementary signal (with logic "0" level) of the second warning signal W2 causes the AND gate 52i to yield the output signal of logic "0" level. The RS flip flop circuit 52a remains in the reset-state or logic "0" level because the first warning signal W1 is logic "0" level. Then, the OR gate 52j produces the output bit D2 of logic "0" level in the copresence of the output signals of the AND gate 52i and the RS flip flop circuit 52a both in logic "0" levels. Since the first warning signal W1 is logic "0" level, the AND gate 52h produces the output signal of logic "0" level. The third timing signal t2 and the output signal D01 are logic "0" levels, and the OR gate 52k produces the output bit of logic "0" level because all of the input signals thereof are logic "0" levels. The OR gate 52l also produces the output bit D0 of logic "0" level in the copresence of output signal D00 of logic "0" level and the fourth timing signal t3 of logic "0" level. Thus, the sequential approximation controlling circuit 52 produces the digital output signal Dout having the bit string of (000). With the bit string (000), the comparison voltage signal Vdac becomes the ground level or zero volt, and the voltage level Vx is calculated as $$Vx = 3.5 + (0-0) = 3.5 \text{ (volts)}$$

From Equation 4, dVout is indefinite. i.e. neither value "1" nor value "0", and no decision is made by the sequential approximation controlling circuit 52 on the basis of the indefinite controlling signal CNT or dVout. However, no error in operation takes place, because the second warning signal W2 forcibly maintains the RS flip flop circuit 52a in the reset state.

If the sequence proceeds to the third stage t2 with the third timing signal t2 of logic "1" level fed from the D flip flop circuit 52f, the OR gate 52k produces the output bit D1 of logic "1" level even if the RS flip flop circuit 52b can not change the output signal D01 due to the indefinite controlling signal CNT. The OR gate 52j keeps the output bit D2 in logic "0" level, and no change takes place in the output bit D0 in the co-presence of the fourth timing signal t3 of logic "0" level and the indefinite controlling signal CNT. Thus, the digital output signal Dout changes the bit string to (010) in the third stage t2. The bit string (010) causes the digital-to-analog converting circuit 53 to produce the comparison voltage signal Vdac of a quarter of the reference voltage level Vref or about 1.25 volt. Then, the voltage level Vx is calculated as $$Vx = 3.5 + (1.25 - 0) = 4.75 \text{ (volts)}$$

The controlling signal CNT escapes from the indefinite state because dVout is given in the negative from Equation 4.

In the fourth stage t3 of the sequence, the third timing signal t2 is latched in the D flip flop circuit 52g, and the fourth timing signal t3 is fed from the D flip flop circuit 52g to the OR gate 52l. This results in the output bit D0 of logic "1" level. However, no alternation takes place in the RS flip flop circuits 52a and 52b in the presence of the controlling signal of value "0", and the sequential approximation controlling circuit 52 produces the digital output signal Dout having the bit string of (001). The digital output signal Dout results in the comparison voltage signal Vdac of a eighth if the comparison voltage Vref or about 0.625 volt. Then, the voltage level Vx is calculated as $$Vx = 3.5 + (0.625 - 0) = 4.125 \text{ (volts)}$$

The controlling signal CNT is maintained in value "0", and the successive approximation is thus achieved.

As will be understood from the foregoing description, the first or second warning signal W1 or W2 forcibly maintains either RS flip flop circuit 52a or 52b in the reset state, and, for this reason, the first comparator circuit 54a is protected from undesirable biasing state. In other words, the first and second warning signals guarantee the analog-to-digital converting operation without any trouble under unexpected high input voltage level and/or irregular input-to-output voltage characteristics of the inverter circuit 4d. Thus, the analog-to-digital converting unit according to the present invention is applicable to various electronic system because of the wide dynamic range. Moreover, the analog-to-digital converting unit according to the present invention allows the inverter circuit 4d to have a substantial amount of fluctuation in the input-to-output characteristics, and, therefore, the production cost is decreased.

Second Embodiment

Figure 8:
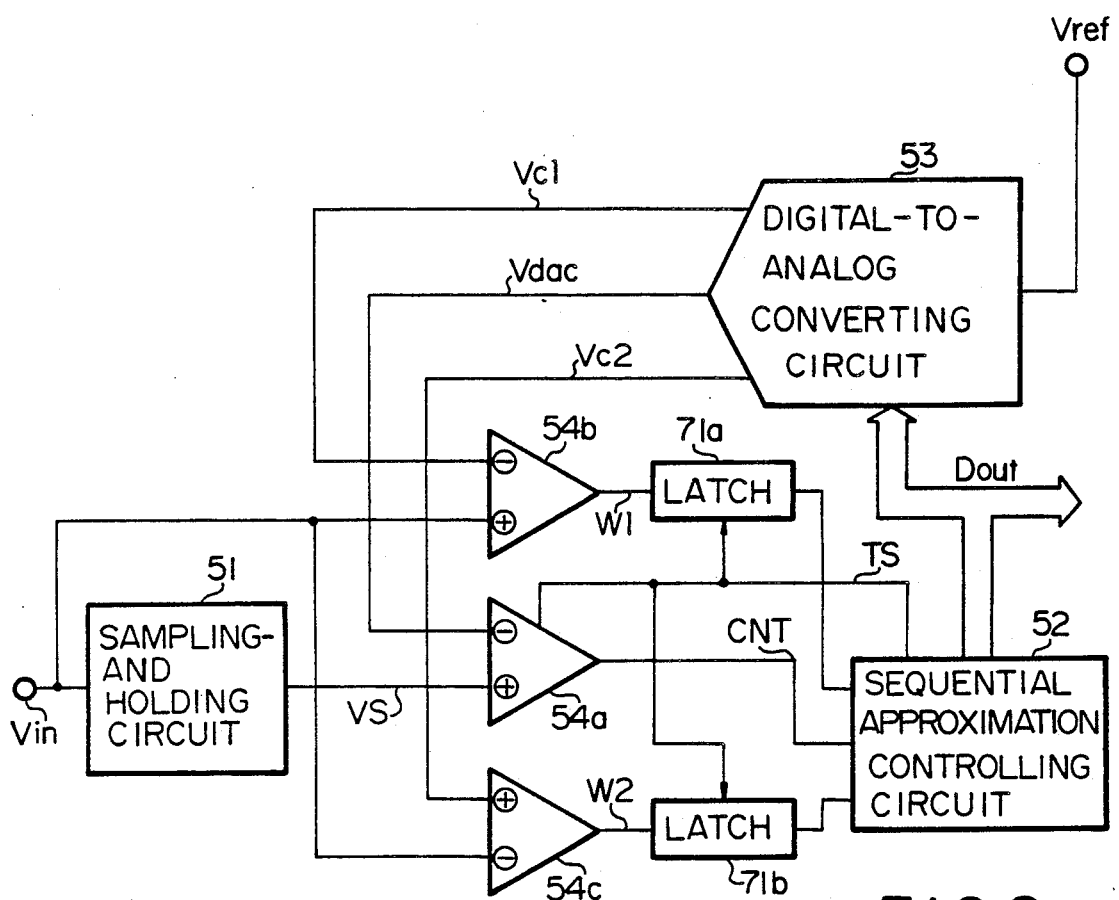
FIG. 8 is a block diagram showing the circuit arrangement of another analog-to-digital converting unit according to the present invention.

Turning to FIG. 8 of the drawings, another analog-to-digital converting unit according to the present invention is illustrated. The analog-to-digital converting unit shown in FIG. 8 is similar in circuit arrangement to that shown in FIG. 5 with the exception of D-type latching circuits 71a and 71b, and, for this reason, no further description is incorporated hereinbelow for components corresponding to those incorporated in the first embodiment. The corresponding components are designated by the same reference numerals.

The D-type latching circuits 71a and 71b are coupled between the second and third comparating circuits 54b and 54c and the sequential approximation controlling circuit 52 and memorize the first and second warning signals W1 and W2 in response to the first timing signal TS. Since the latching circuits 71a and 71b fixedly memorize the warning signals W1 and W2, the warning signals W1 and W2 are valid regardless of any fluctuation of the analog input voltage signal Vin and enhance the reliability of the analog-to-digital converting operation.

Although particular embodiments of the present invention have been shown and described, it will be obvious to those skilled in the art that various changes and modifications may be made without departing from the spirit and scope of the present invention.

What is claimed is:

1. An analog-to-digital converting unit comprising
    (a) a sampling-and-holding circuit supplied with an analog input voltage signal and producing a series of sampled voltage signals at time intervals,
    (b) a sequential approximation controlling circuit responsive to a controlling signal and first and second warning signals and producing a digital output signal with a bit string,
    (c) a digital-to-analog converting circuit supplied with said digital output signal and producing a comparison voltage signal depending upon said bit string and first and second critical signals respectively indicative of the uppermost and lowermost voltage levels of said analog input voltage signal to which said analog-to-digital converting unit responds,
    (d) a first analog comparator circuit comparing one of said sampled voltage signals with said comparison voltage signal and producing said controlling signal,
    (e) a second analog comparator circuit comparing said analog input voltage signal with said first critical signal and producing said first warning signal, and
    (f) a third analog comparator circuit comparing said analog input voltage signal with said second critical signal and producing said second warning signal, in which said sequential approximation controlling circuit restricts said bit string in the presence of either first or second warning signal so that said comparison voltage signal falls within a predetermined range regardless of said controlling signal.

2. An analog-to-digital converting unit as set forth in claim 1, in which said analog first comparator circuit comprises a first switching element supplied at one end thereof with said comparison voltage signal, a second switching element supplied at one end therefore with said sampled voltage signal, a capacitor, having first and second electrodes coupled at the first electrode thereof to other ends of said first and second switching elements, an inverter circuit, having an input node and an output node, coupled at the input node thereof to the second electrode of said capacitor, and a third switching element coupled between the input node and the output node of said inverter circuit.

3. An analog-to-digital converting circuit as set forth in claim 2, in which said sequential approximation controlling circuit comprises a first RS flip flop circuit supplied at reset nodes thereof with a trigger signal and said second warning signal and at set nodes thereof with said first warning signal, a second timing signal and said controlling signal, a second RS flip flop circuit supplied at a reset node thereof with said trigger signal and at set nodes thereof with said controlling signal and a third timing signal, a third RS flip flop circuit supplied at a reset node thereof with said trigger signal and at set nodes thereof with said controlling signal and a fourth timing signal, a first D flip flop circuit supplied with said trigger signal and producing a first timing signal, a second D flip flop circuit supplied with said first timing signal and producing said second timing signal, a first AND gate supplied with said second timing signal and the complementary signal of said second warning signal, a first OR gate supplied with output signals of said first AND gate and said first RS flip flop circuit and producing a first output bit of said digital output signal, a third D flip flop circuit supplied with said second timing signal and producing said third timing signal, a second AND gate supplied with said second timing signal and said first warning signal, a second OR gate supplied with said third timing signal and output signals of said second AND gate and said second RS flip flop circuits and producing a second output bit of said digital output signal, a fourth D flip flop circuit supplied with said third timing signal and producing said fourth timing signal, and a third OR gate supplied with the fourth timing signal and the output signal of said third RS flip flop circuit and producing a third output bit of said digital output signal.

4. An analog-to-digital converting unit as set forth in claim 2, in which said analog-to-digital converting unit further comprises a first latching circuit coupled between said second analog comparator circuit and said sequential approximation controlling circuit, and a second latching circuit coupled between said third analog comparator circuit and said sequential approximation controlling circuit.

5. An analog-to-digital converting circuit as set forth in claim 3, in which said analog-to-digital converting unit further comprises a first latching circuit coupled between said second analog comparator circuit and said sequential approximation controlling circuit, and a second latching circuit coupled between said third analog comparator circuit and said sequential approximation controlling circuit.

* * * * *